United States Patent
Henderson et al.

(10) Patent No.: US 8,604,626 B2
(45) Date of Patent: Dec. 10, 2013

(54) REDUCED SUSCEPTIBILITY TO ELECTROSTATIC DISCHARGE DURING 3D SEMICONDUCTOR DEVICE BONDING AND ASSEMBLY

(75) Inventors: Brian M. Henderson, San Diego, CA (US); Ronnie A. Lindley, San Diego, CA (US); Dong Wook Kim, San Diego, CA (US); Reza Jalilizeinali, San Diego, CA (US); Shiqun Gu, San Diego, CA (US); Matthew M. Nowak, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/470,692

(22) Filed: May 14, 2012

(65) Prior Publication Data
US 2013/0127046 A1    May 23, 2013

Related U.S. Application Data

(63) Continuation of application No. 12/421,096, filed on Apr. 9, 2009, now Pat. No. 8,198,736.

(51) Int. Cl.
H01L 23/48    (2006.01)
H01L 23/52    (2006.01)
H01L 29/40    (2006.01)

(52) U.S. Cl.
USPC .......................................................... 257/779

(58) Field of Classification Search
USPC .................................................. 257/779–781
See application file for complete search history.

(56) References Cited

U.S. PATENT DOCUMENTS

| | | | |
|---|---|---|---|
| 7,335,995 B2 * | 2/2008 | Pflughaupt et al. | ........... 257/779 |
| 7,535,105 B2 | 5/2009 | Voldman | |
| 7,902,668 B2 | 3/2011 | Sato | |
| 2003/0218235 A1 | 11/2003 | Searls et al. | |
| 2007/0029646 A1 | 2/2007 | Voldman | |
| 2008/0230903 A1 | 9/2008 | Sato | |
| 2011/0089561 A1 | 4/2011 | Kurita et al. | |
| 2011/0204504 A1 | 8/2011 | Henderson et al. | |

FOREIGN PATENT DOCUMENTS

EP    1617473    1/2006

OTHER PUBLICATIONS

International Search Report and Written Opinion—PCT/US2010/030577, International Search Authority—European Patent Office—Jul. 5, 2010.
Matthias T, et al., "3D process integration. Wafer-to-wafer and chip-to-wafer bonding" Enabling Technologies for 3-D Integration Symposium—Nov. 27-29, 2006, pp. 231-237, XP009104011 p. 232-p. 233.

* cited by examiner

Primary Examiner — Jenny L Wagner
(74) Attorney, Agent, or Firm — Michelle S. Gallardo

(57) ABSTRACT

Electrostatic discharge susceptibility is reduced when assembling a stacked IC device by coupling a ground plane of a first semiconductor device and a ground plane of a second semiconductor device to place the ground plane at substantially a same electrical potential. Active circuitry on the first semiconductor device and active circuitry on the second semiconductor device are electrically coupled after the ground planes are coupled. Electrically coupling the ground planes of the first and the second semiconductor device creates a preferred electrostatic discharge path to ground, thus reducing potential damage to sensitive circuit elements.

8 Claims, 9 Drawing Sheets

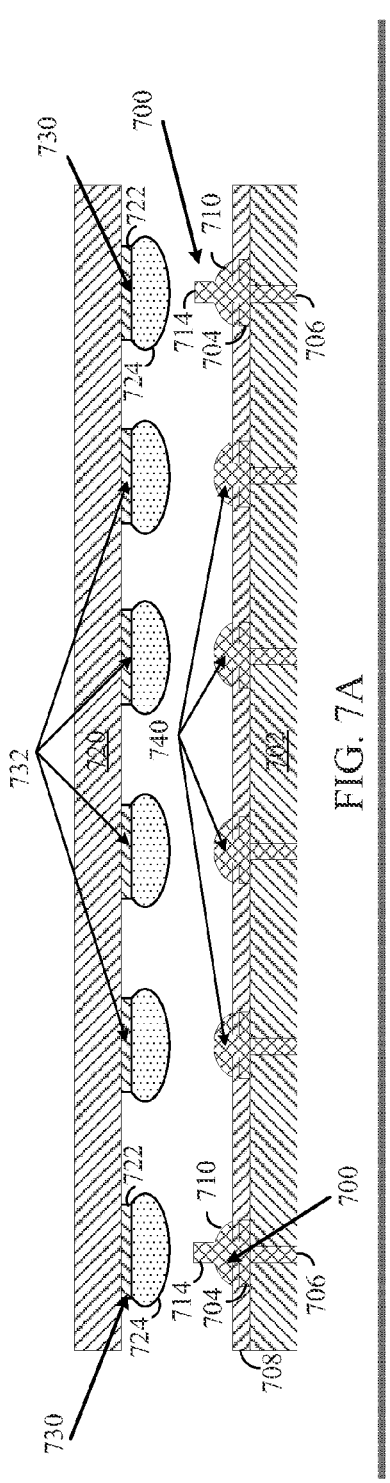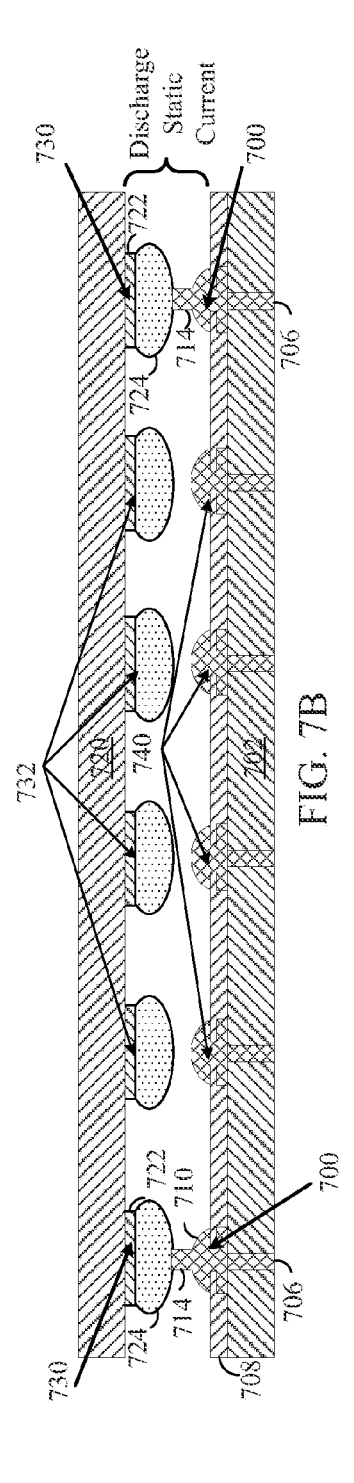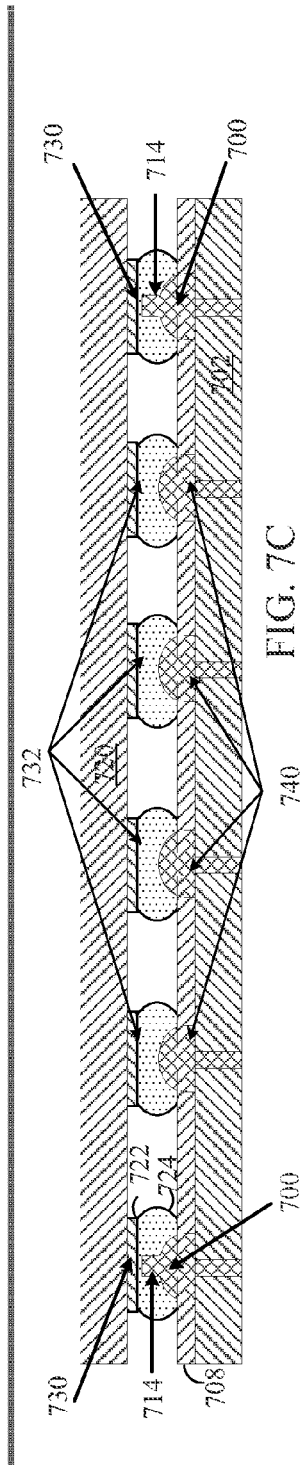

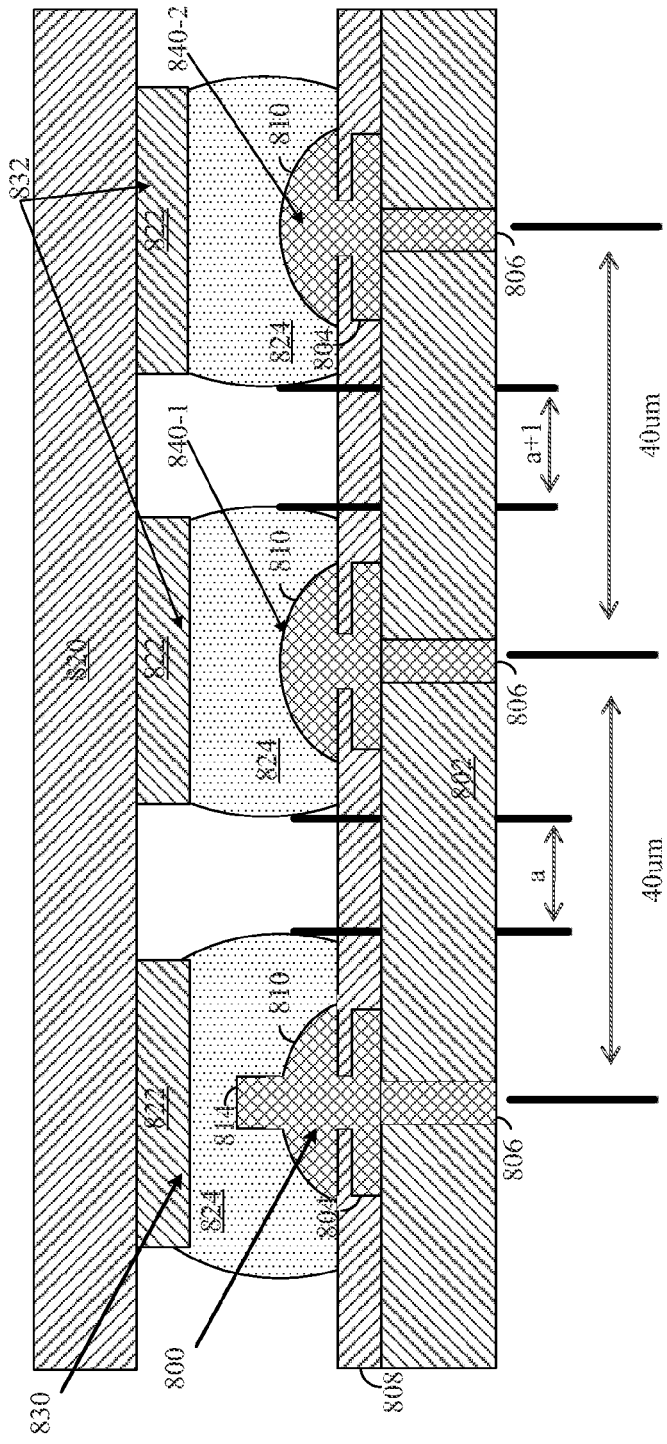
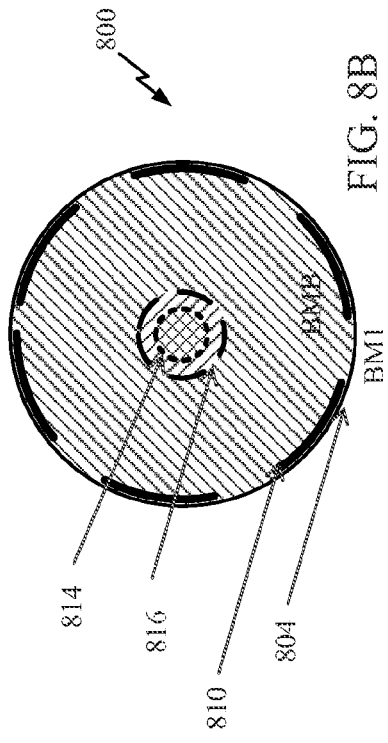
FIG. 8A
FIG. 8B

REDUCED SUSCEPTIBILITY TO ELECTROSTATIC DISCHARGE DURING 3D SEMICONDUCTOR DEVICE BONDING AND ASSEMBLY

This application is a continuation in part of U.S. patent application Ser. No. 12/421,096, entitled "REDUCED SUSCEPTIBILITY TO ELECTROSTATIC DISCHARGE DURING 3D SEMICONDUCTOR DEVICE BONDING AND ASSEMBLY" and filed on Apr. 9, 2009, in the names of Henderson, et al., the disclosure of which is expressly incorporated by reference herein in its entire.

TECHNICAL FIELD

The present disclosure generally relates to semiconductor device assembly. More specifically, the present disclosure relates to reducing electrostatic discharge susceptibility in stacked IC device assembly.

BACKGROUND

A 3D semiconductor device (or stacked IC device) can contain two or more semiconductor devices stacked vertically so they occupy less space than two or more conventionally arranged semiconductor devices. The stacked IC device is a single integrated circuit built by stacking silicon wafers and/or ICs and interconnecting them vertically so that they behave as a single device.

Conventionally, the stacked semiconductor devices are wired together using input/output ports either at the perimeter of the device or across the area of the device or both. The input/output ports slightly increase the length and width of the assembly. In some new 3D stacks, through-silicon vias (TSVs) completely or partly replace edge wiring by creating vertical connections through the body of the semiconductor device. By using TSV technology, stacked IC devices can pack a great deal of functionality into a small footprint. This TSV technique is sometimes also referred to as TSS (Through Silicon Stacking). Furthermore, critical electrical paths through the device can be drastically shortened, reducing capacitance and resistance and therefore improving power dissipation, and performance.

Assembly and packaging of semiconductor devices should take into account the adverse affects of electrostatic discharge. Conventionally, there are several ways of reducing ESD. One is to provide proper grounding of assembly equipment parts to prevent charge buildup that may result in discharge capable of destroying circuit components, such as transistors. A second is use of ionized air-flow to reduce charge build-up on the ICs and the assembly fixtures. Another way is to eliminate or reduce ESD damage by providing ESD protection circuitry on the semiconductor device.

However, in stacked IC device assembly and connection, to maximize the density of connections and reduce electrical parasitics, circuit-level ESD protection is reduced or eliminated. The semiconductor devices may then be more susceptible to damage from ESD during assembly. The same ESD susceptibility concerns apply whether the assembly process is chip-to-chip (i.e., IC-to-IC) or chip to wafer (i.e., IC-to-wafer) or wafer to wafer. Therefore, there is a need to develop methods and structures to enable the assembly of stacked IC devices with reduced sensitivity to ESD when protection circuitry is not included in every individual IC or wafer.

BRIEF SUMMARY

One aspect of the present disclosure provides a semiconductor device. Multiple pads are coupled to active circuitry of the semiconductor device. The device also includes at least one extended pad coupled to a ground plane of the semiconductor device. The extended pad has a structure including a first portion similar to the active circuitry pads of the semiconductor device and a second portion that increases a height of the at least one extended pad.

In another aspect, a method of forming an extended conductive pad of an integrated circuit (IC) device is described. The method includes forming a first portion of the extended conductive pad. The method also includes patterning a photoresist layer over a portion of the first portion to expose an area of the first portion. Additionally, the method includes forming a second portion of the extended conductive pad on the exposed area.

Another aspect discloses a first semiconductor device. The semiconductor includes contact means for coupling active circuitry of the first semiconductor device. The device further includes a means for placing the ground plane of the first semiconductor device and a ground plane of the second semiconductor device at substantially the same electrical potential before coupling the contact means of the first semiconductor device to contact means of the second semiconductor device. In addition, the reducing means includes contact means and means for extending a height of the reducing means.

Another aspect discloses a method for assembling a first semiconductor device with a second semiconductor device to create a stacked integrated circuit (IC) device. The method stacks the first semiconductor device, including conductive pads coupled to active circuitry of the first semiconductor device and at least one extended pad coupled to a ground plane of the first semiconductor device, onto the second semiconductor device. The method also places, by the at least one extended pad, the ground plane of the first semiconductor device and a ground plane of the second semiconductor device at substantially a same electrical potential before coupling the conductive pads of the first semiconductor device to conductive pads of the second semiconductor device.

The foregoing has outlined rather broadly the features and technical advantages of the present disclosure in order that the detailed description that follows may be better understood. Additional features and advantages will be described hereinafter which form the subject of the claims of the disclosure. It should be appreciated by those skilled in the art that the conception and specific embodiments disclosed may be readily utilized as a basis for modifying or designing other embodiments for carrying out the same purposes of the present disclosure. It should also be realized by those skilled in the art that such equivalent constructions do not depart from the technology of the disclosure as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

FIGS. 7A-7C illustrate assembly of stacked IC devices with the use of the extended ground plane conductive pad shown in FIG. 6E, according to one aspect of this disclosure.

FIG. 8A illustrates a sectional view of an assembled 3D semiconductor device including an extended ground plane conductive pad according to one aspect of the disclosure.

FIG. 8B illustrates a top down view of an extended ground plane conductive pad according to one aspect of the disclosure.

DETAILED DESCRIPTION

Figure 1:
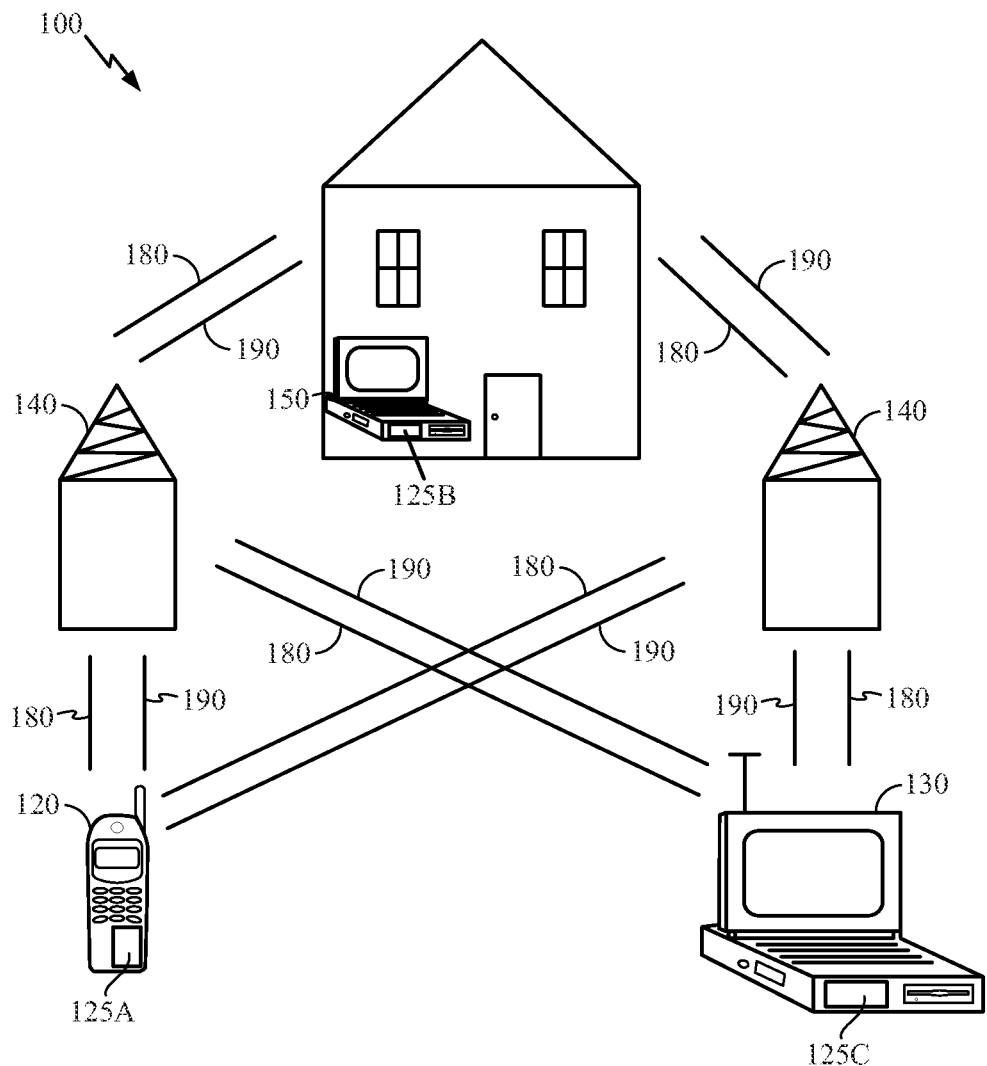
FIG. 1 is a block diagram showing an exemplary wireless communication system in which an embodiment of the disclosure may be advantageously employed.

FIG. 1 shows an exemplary communication system 100 in which an embodiment of the disclosure may be advantageously employed. For purposes of illustration, FIG. 1 shows three remote units 120, 130, and 150 and two base stations 140. It will be recognized that conventional communication systems may have many more remote units and base stations. Remote units 120, 130, and 150 include 3D stacked semiconductor devices 125A, 125B and 125C, which are embodiments of the disclosure as discussed further below. FIG. 1 shows forward link signals 180 from the base stations 140 and the remote units 120, 130, and 150 and reverse link signals 190 from the remote units 120, 130, and 150 to base stations 140.

In FIG. 1, remote unit 120 is shown as a mobile telephone, remote unit 130 is shown as a portable computer, and remote unit 150 is shown as a fixed location remote unit. For example, the remote units may be cell phones, hand-held personal communication systems (PCS) units, portable data units such as personal data assistants, or fixed location data units such as meter reading equipment. Although FIG. 1 illustrates remote units according to the teachings of the disclosure, the disclosure is not limited to these exemplary illustrated units. Embodiments of the disclosure may be suitably employed in any device which includes stacked IC devices.

Figure 2:
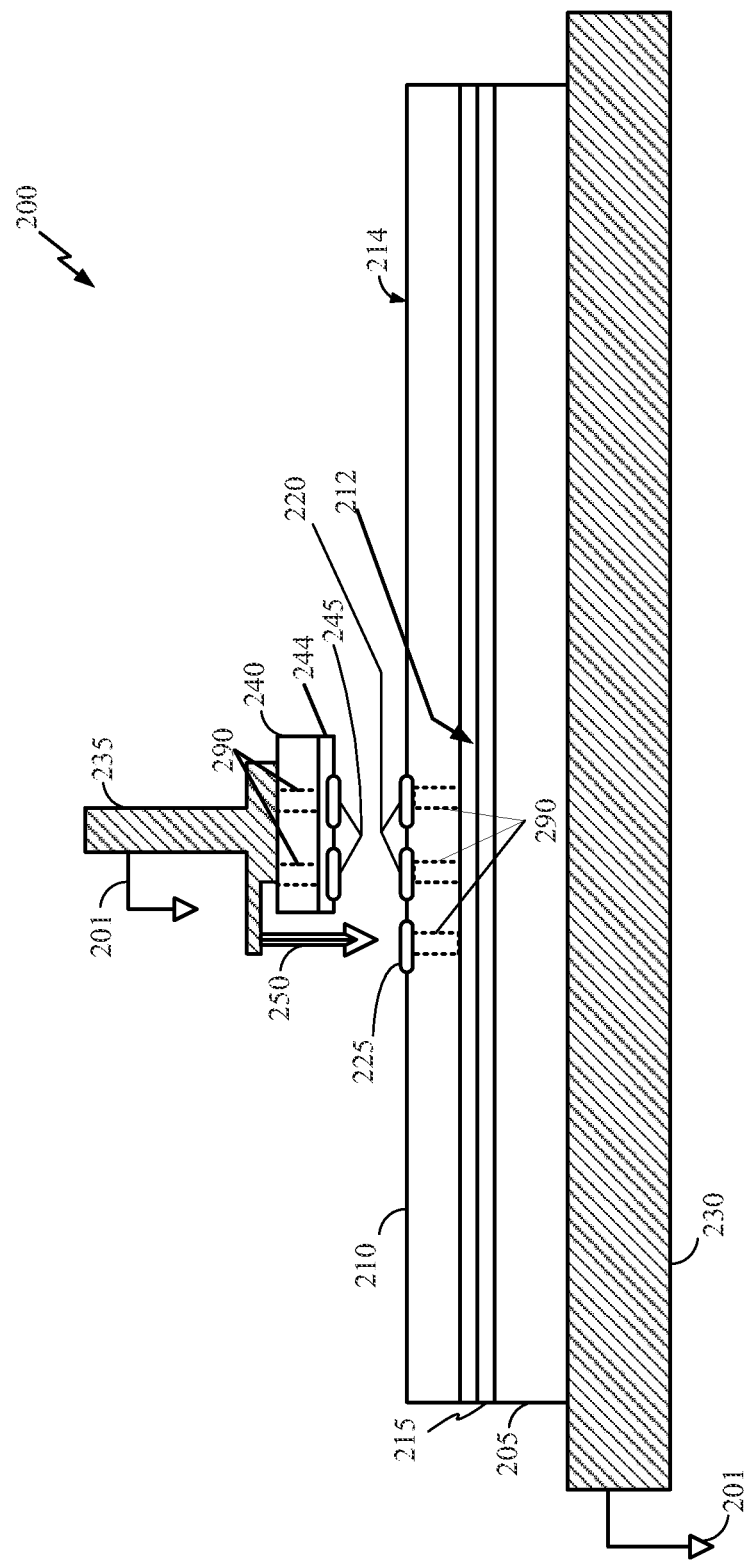
FIG. 2 is an illustration of an embodiment of a system for assembling stacked IC devices.

FIG. 2 shows an embodiment of a system 200 for assembling integrated circuits in 3D in accordance with the disclosure. The system 200 includes a carrier 205 on which is placed a first semiconductor device 210. A temporary adhesive 215 may be used to affix the first semiconductor device 210 to the carrier 205. The first semiconductor device 210 may be a wafer or an IC. The first semiconductor device 210 includes active circuitry (not shown) on an active face 212, and a ground plane (not shown). The first semiconductor device 210 may be placed on the carrier 205 with the active face 212 toward and contacting the carrier 205 or the temporary adhesive 215. Alternatively, the back face 214 faces and contacts the carrier 205 or temporary adhesive 215. In FIG. 2, the active face 212 is shown facing the carrier 205.

In either alternative arrangement, at least one conductive pad 225 (e.g., micro-bump) can be placed on the side of the first semiconductor device 210 not facing the carrier 205. The conductive pad 225 is in electrical contact with the ground plane of the semiconductor device 210. The ground plane and the conductive pad 225 provide low resistance paths to reduce an electrical potential that may occur, thus reducing the likelihood of electrostatic discharge damage to active circuitry. In one embodiment, the conductive pad 225 is provided in a scribe line.

The first semiconductor device 210 may have additional low resistance conductive pads 220 for electrical connections to the active circuitry. In case the ground plane and/or active circuitry are located on the opposite sides of the first semiconductor device 210 from the conductive pads 220, 225, optional through silicon vias (TSVs 290) can be used to provide low resistance electrical connections between the conductive pads 220, 225 to the respective ground plane and active circuitry on the opposite side of the first semiconductor device 210. Although the terminology "through silicon via" includes the word silicon, it is noted that through silicon vias are not necessarily constructed in silicon. Rather, the material can be any device substrate material.

The carrier 205 can be placed on a movable pick-and-place (PnP) chuck 230 (i.e., PnP chuck 230), which is electrically conductive, i.e., is a low resistance path. Furthermore, the PnP chuck 230 can be connected to a common electrical ground 201.

In an embodiment, the system 200 can further include a conductive movable PnP head 235 electrically connected to provide a low resistance path to the same common electrical ground 201 as the PnP chuck 230. The PnP head 235 carries a second semiconductor device 240 having a ground plane (not shown) and active circuitry 244. The second semiconductor device 240 may be an IC. The orientation of the second semiconductor device 210 can result in an active face 244 facing the first semiconductor device 210 (as shown in FIG. 2) or, alternatively, facing the PnP head 235. In either embodiment, the PnP head 235 is in electrical communication with the ground plane of the second semiconductor device 210 to place the ground plane of the second semiconductor device 240 at substantially the same electrical potential as the PnP head 235 by direct contact, or by one or more optional TSVs 290 to the opposite side of the second semiconductor device 240. The PnP head 235 is coupled to the common electrical ground 201, and therefore is also at substantially the same electrical potential as the PnP chuck 230 and the ground plane of the second semiconductor device 240.

The second semiconductor device 240 has low resistance conductive pads 245 electrically connected to active circuitry that are brought into electrical connection with active circuitry on the first semiconductor device 210 when contacted to the corresponding conductive pads 220 during assembly.

The PnP head 235 head includes a low resistance electrical contact probe 250 to electrically couple to the conductive pad 225 on the first semiconductor device 210 as the PnP head 235 is moved to position the second semiconductor device 240 for assembly to the first semiconductor device 210. The contact probe 250 contacts the conductive pad 225 before the conductive pads 245 contact the corresponding conductive pads 220, reducing susceptibility to ESD. The contact probe 250 may be, for example, a spring loaded pogo pin, or an equivalent. This ensures that the ground planes of the first semiconductor device 210 and the second semiconductor device 240 achieve substantially the same electrical potential before the active circuitry of the first semiconductor device 210 and the second semiconductor device 240 are brought into electrical communication. Various combination of the conductive pad 225, optional TSVs 290 (depending on the first semiconductor device orientation), the grounded PnP chuck 230, the grounded PnP head 235 and the contact probe 250 may be used in suitable embodiments to ensure that the first semiconductor device ground plane is at substantially the same electrical potential as the ground plane of the second semiconductor device 240 prior to final chip-to-wafer or chip-to-chip assembly.

As shown in FIG. 2, the second semiconductor device 210 is held on the PnP head 235 so that the active face 244 will contact the back face 214 of the first semiconductor device 210 when assembled. The system 200 may also be used to assemble semiconductor devices in 3D with the active faces 212 and 244 facing each other for assembly. The TSVs 290 may be included to connect the ground plane to the PnP head 235 from the opposite side of the semiconductor device 240 if the ground plane is located on the opposite side from the PnP head 235.

In some embodiments, for example where the first semiconductor device 210 is a wafer, the ground plane conductive pad 225 may be disposed in a scribe lane.

Figure 3:
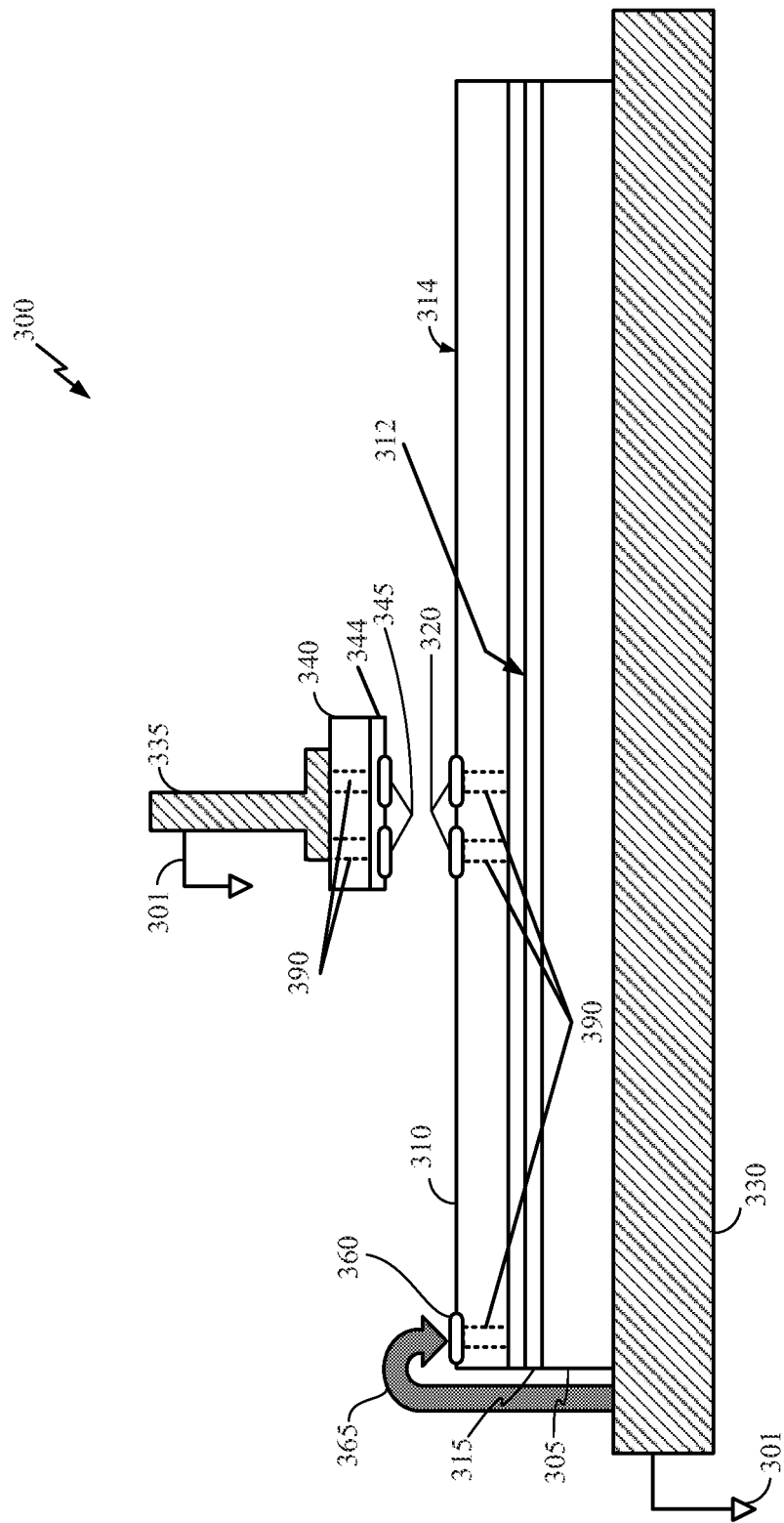
FIG. 3 is an illustration of a second embodiment of a system for assembling stacked IC devices.

FIG. 3 shows an embodiment of a system 300 for assembling integrated circuits in 3D in accordance with the disclosure. Several elements are identical to those described in FIG. 2, and will not be discussed in detail.

The system 300 differs from the system 200 because the system 300 includes a PnP head 335 holding a second semiconductor device 340 that differs from the PnP head 235 of the system 200 by not including the contact probe 250. Instead, a low resistance wafer conductive edge clip 365 makes an electrical connection between a PnP chuck 330 and a conductive pad 360 on the upward facing surface of a first semiconductor device 310, shown as a back face 314 in FIG. 3. The conductive pad 360 is in electrical communication with the ground plane (not shown) of the first semiconductor device 310. The conductive pad 360 may be located, for example, in a scribe line of the first semiconductor device 310. If the first semiconductor device 310 is a wafer, the conductive pad 360 electrically couples to and "shorts" the ground planes of all die in the wafer.

When the ground plane of the first semiconductor device 310 is on the same surface as the conductive pad 360, a TSV 390 is not used. When the ground plane of the first semiconductor device 310 is on the opposite side, at least one TSV 390 may be used to couple the conductive pad 360 to the ground plane. As in the system 200, all conductive pads, ground planes and TSVs are low resistance paths.

When contact is made between the wafer conductive edge clip 365 and the conductive pad 360, the ground plane of the first semiconductor device 310 is then substantially grounded to the PnP chuck 330, which is also at the same potential as the PnP head 335, similar to the PnP head 235 of the embodiment of the system 200. When contact is made between the conductive edge clip 365 and the conductive pad 360, there is a reduced susceptibility to ESD. In case the semiconductor device 310 is placed on a carrier 305 with the active face 312 downward, i.e., toward the carrier 305, the conductive pads 320 may be in electrical communication with the active circuitry on the active face 312 via at least one TSV 390.

The structure of the system 300 thus establishes electrical communication between the ground planes of both the first semiconductor device 310 and the second semiconductor device 340 to place them at substantially the same electrical potential before electrical contact is actually made between the active circuitry of the first semiconductor device 310 and the second semiconductor device 340.

It can be appreciated that, from geometrical considerations, the system 300 is appropriate for a chip-to-wafer configuration (i.e., where the first semiconductor device 310 is a wafer, and the second semiconductor device 340 is an IC, i.e., a chip, or die). Two wafers of the same dimensions may not be stacked in this manner, due to the location of the wafer conductive edge clip 365. Alternatively, the first semiconductor device 310 may be an IC of larger dimension than the second semiconductor device 340 in order to provide an exposed location for the wafer conductive edge clip 365 to contact the conductive pad 360.

The system 300 has a common electrical ground 301, a temporary adhesive 315, an active face 344, and active circuit conductive pads 345, in correspondence with similar structures shown in FIG. 2.

Figure 4:
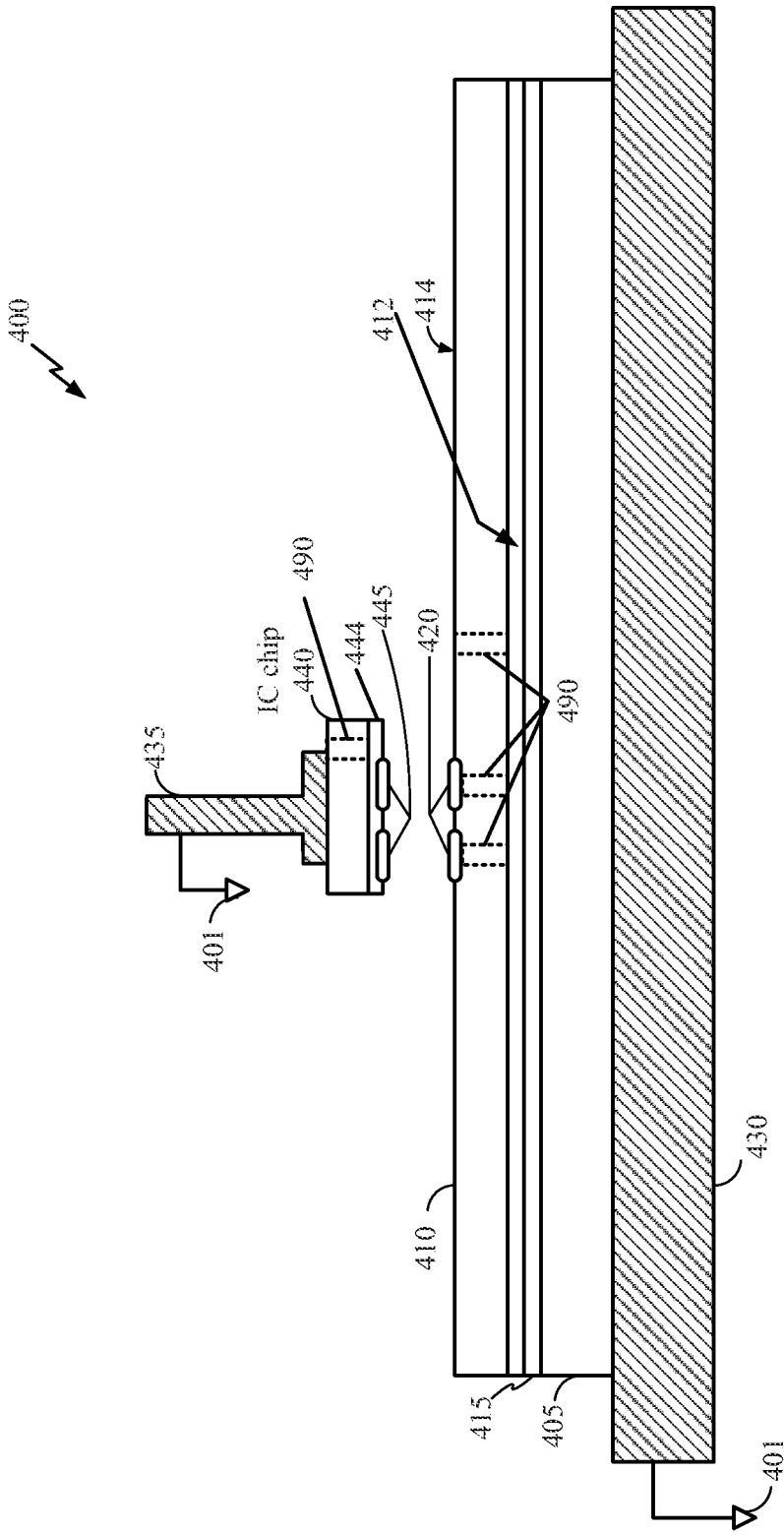
FIG. 4 is an illustration of a third embodiment of a system for assembling stacked IC devices.

FIG. 4 shows an embodiment of a system 400 for assembling ICs in 3D in accordance with the disclosure. Many elements are identical to those described in FIG. 2 and/or FIG. 3, and will not be discussed in detail.

The system 400 differs from the system 200 and/or the system 300 in the following respects: The system 400 may not include the wafer conductive edge clip 365 and the conductive pad 360 of the system 300 of FIG. 3, or the contact probe 250 to make an electrical connection to the conductive pad 225, as in the system 200 of FIG. 2. Instead, an electrically conductive temporary adhesive 415 and a conductive carrier 405 provide a conductive path between the ground plane of a first semiconductor device 410 and a PnP chuck 430 to reduce susceptibility to ESD. As in the systems 200 and 300, a PnP head 435, holding a second semiconductor device 440, and the PnP chuck 430, holding the conductive carrier 405, are coupled to a common ground 401. Therefore, the respective ground planes of a first semiconductor device 410 and the second semiconductor device 440 are brought to substantially a same electrical potential before respective conductive pads 420 and 445 are electrically connected in the assembly process to electrically couple the active circuitry of the first semiconductor device 410 and the second semiconductor device 440.

As shown in FIG. 4, an active face 444 of the second semiconductor device 440 includes the conductive pads 445 and is positioned to assemble to a back face 414 of the first semiconductor device 410. However, the first semiconductor device 410 may be alternatively configured on the conductive carrier 405 to have the active face 412 facing the second semiconductor device 440. The conductive pads 420 and 445 may be disposed on the facing sides of the first semiconductor device 410 and the second semiconductor device 440, respectively, to enable electrical connection between the respective active circuitry. Where desired, the TSVs 490 may be included to provide electrical connection to the opposite side of either or both the first semiconductor device 410 and the second semiconductor device 440, as previously described.

Figure 5:
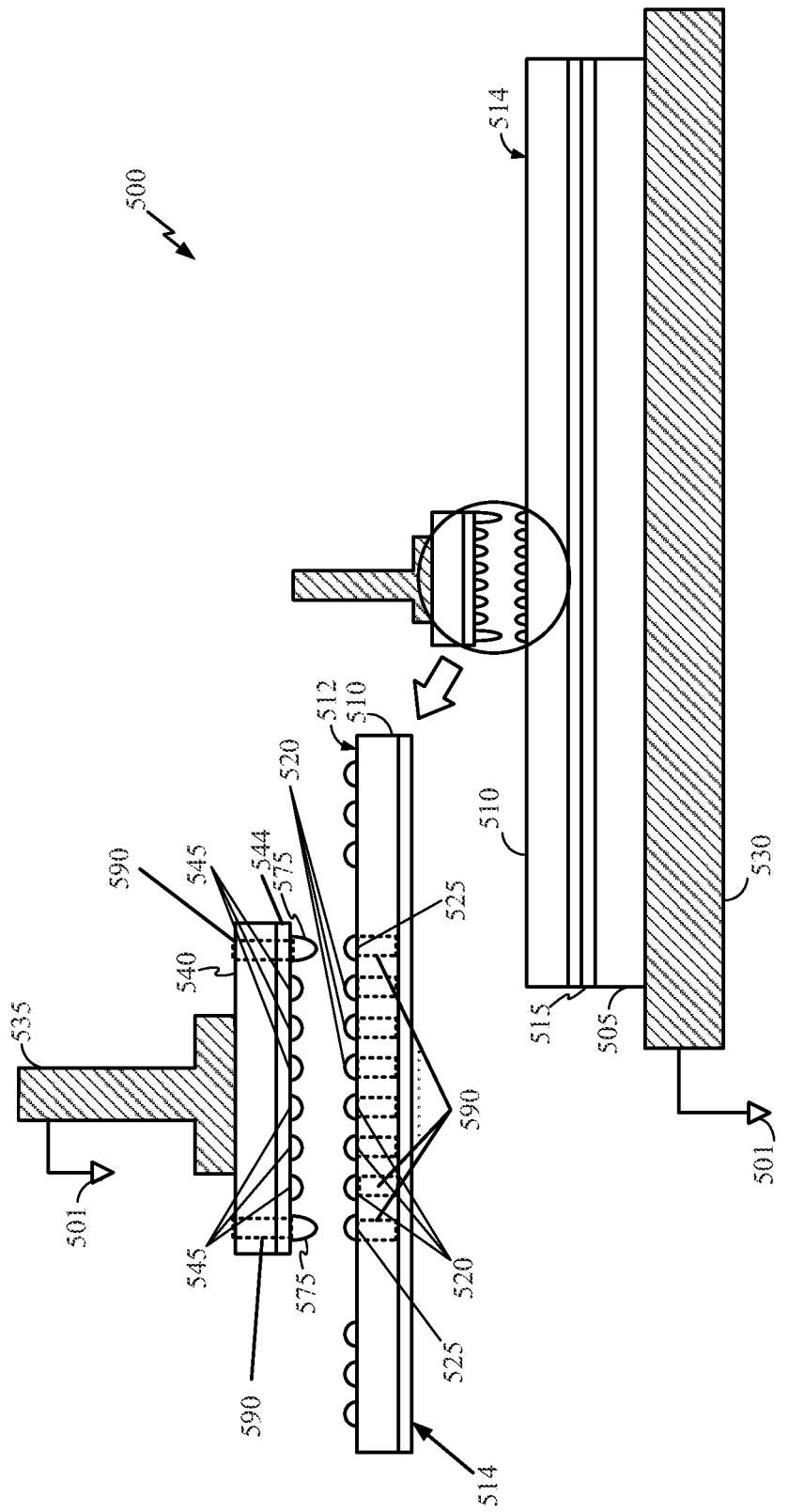
FIG. 5 is an illustration of a fourth embodiment of a system for assembling stacked IC devices.

FIG. 5 shows an embodiment of a system 500 for assembling semiconductor devices in 3D in accordance with the disclosure. Many elements are substantially identical or similar to those described in FIGS. 2, 3 and/or 4, and will not be discussed in detail.

The system 500 is adapted to assemble a second semiconductor device 540 to a first semiconductor device 510. Active circuitry conductive pads 520 in electrical communication with active circuitry on an active face 514 and ground plane conductive pads 525 in electrical communication with a ground plane on the first semiconductor device 510 may be micro-bumps, for example. Similarly, the second semiconductor device 540 includes active circuitry conductive pads 545 (that may also be micro-bumps) in electrical communication with active circuitry on an active face 544 of the second semiconductor device 540. The active circuitry conductive pads 545 come in contact with the corresponding active circuitry conductive pads 520 (or micro-bumps) on the first semiconductor device 510 in the course of assembly.

The second semiconductor device 540 also includes ground plane conductive pads 575 in electrical communication with the ground plane of the second semiconductor device 540. The ground plane conductive pads 575 may be low resistance micro-bumps that are larger (e.g., taller if the dies are stacked in a horizontal configuration, as shown) than the active circuitry conductive pads 545. In some aspects of the disclosure, the ground plane conductive pads 575 are larger micro-bumps, such as those shown in FIG. 5. Or in another aspect of the disclosure, the ground plane conductive pads 575 include a conductive pad with a second extended portion over the pad, as shown in FIGS. 6A-8B.

Referring again to FIG. 5, the ground plane conductive pads 575 will come in physical and electrical contact with the ground plane conductive pads 525 before the active circuitry conductive pads 520 and 545 make contact to reduce the susceptibility to ESD. That is, the ground planes of both semiconductor devices 510, 540 are electrically coupled to substantially the same potential before the active circuitry conductive pads 520 and 545 make electrical contact between the active circuitry on the first semiconductor device 510 and the active circuitry of the second semiconductor device 540. Alternatively, the ground plane conductive pads 525 may be larger (e.g., taller) micro-bumps, or both the ground plane conductive pads 575 and 525 may be larger (e.g., taller micro-bumps than the active circuitry conductive pads 520, 545.

A PnP chuck 530 and a PnP head 535 are coupled to a common ground 501, as described above for systems 200, 300 and 400. The ground plane of the second semiconductor device 540 is in electrical communication with the PnP head 535, and is therefore at substantially the same common ground 501, i.e., electrical potential. TSVs 590 are used in the second semiconductor device 540 if the ground plane is on the opposite side of the second semiconductor device 540 that is facing the PnP head 535. A carrier 505 and a temporary adhesive 515 may be conductive or, alternatively, either or both may be non-conductive. Regardless, it may be appreciated that the ground planes of the first semiconductor device 510 and the second semiconductor device 540 can be brought to substantially the same electrical potential before active circuitry on the first semiconductor device 510 and the second semiconductor device 540 are electrically connected as a result of the assembly.

FIGS. 6A-6E show the assembly of an extended ground plane conductive pad for assembling 3D semiconductor devices in accordance with one aspect of the disclosure. Elements that are substantially identical or similar to those described in FIGS. 2, 3, 4 and/or 5 are not discussed in detail.

Figure 6D:
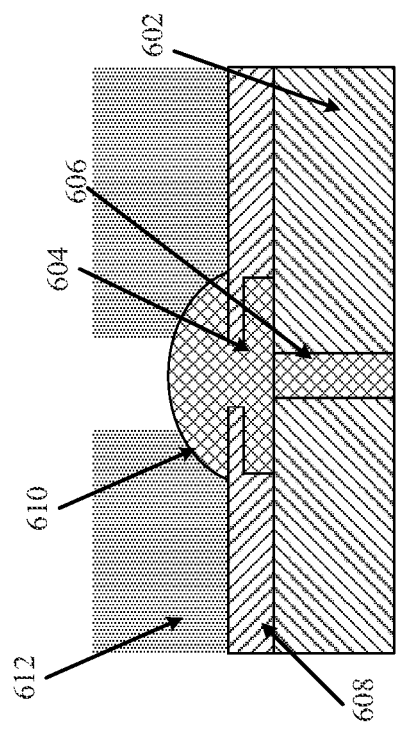
FIGS. 6A-6E illustrate a method of manufacturing a fifth embodiment of a portion of a system for assembling stacked IC devices according to one aspect of this disclosure.
Figure 6E:
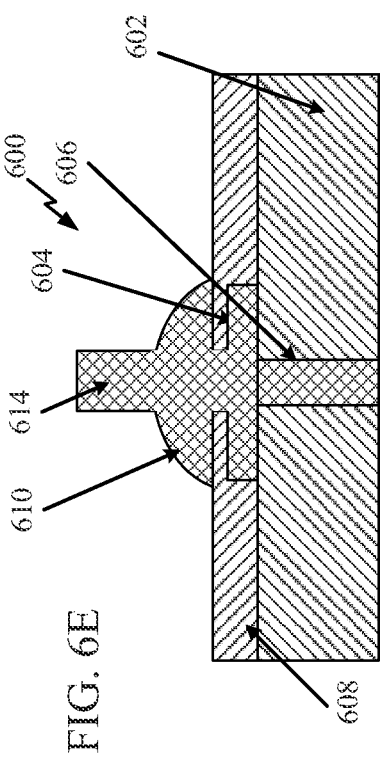
Figure 6A:
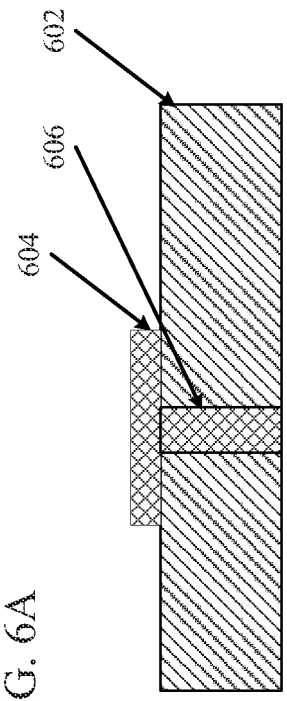
Figure 6B:
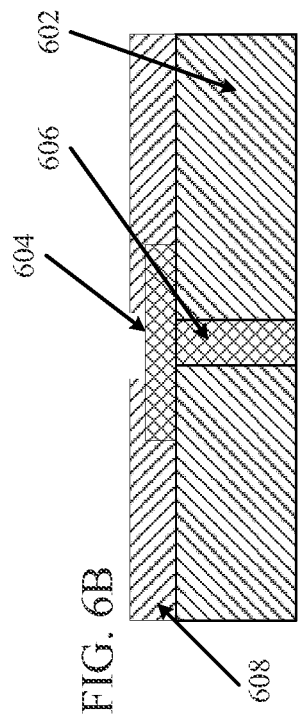
Figure 6C:
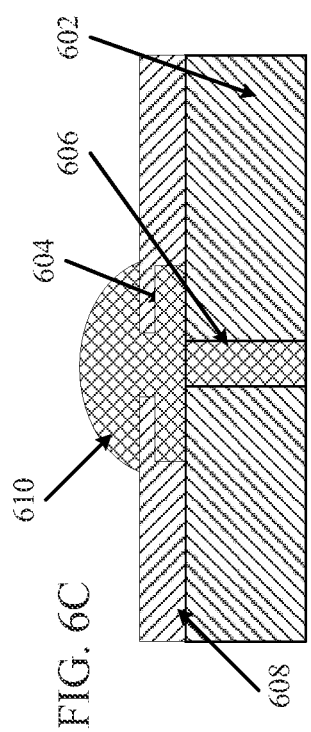

As shown in FIGS. 6A-6E, an extended ground plane conductive pad 600 is formed from a conductive pad modified with either additive or subtractive lithography to create an extension pillar. FIG. 6A shows a substrate 602 with a through via, such as a through silicon via (TSV), 606 and a conductive pad 604 formed over the TSV 606. Next, as shown in FIG. 6B, a passivation layer 608 is deposited over the substrate 602 and an opening is formed within the passivation layer 608 over the conductive pad 604. Following depositing of the passivation layer 608, a conductive bump 610 is formed onto the conductive pad 604 and onto a portion of the passivation layer 608 disposed on the conductive pad 604, as shown in FIG. 6C. The conductive hump 610 may be formed using any suitable method, such as electroplating or other like processes, and may have any shape, in some configurations being substantially hemispherical, semicircular or dome-like shape, as shown in FIG. 6C. Electroplating will likely result in semicircular or dome like shapes but, some other processes may result in a different shape. Next, in FIG. 6D, a photoresist 612 is patterned over the conductive bump 610. An opening is formed within the photoresist 612 to expose the conductive bump 610 for formation of an extension pillar 614, as shown in FIG. 6E.

In FIG. 6E, an extension pillar 614 is formed onto the conductive bump 610 to complete the extended ground plane conductive pad 600. The extension pillar 614 may be formed using suitable methods such as electroplating or other like process. The extension pillar 614 may be formed of the same material as the conductive hump 610 or of any other suitable material including, but not limited to, copper, solder or other like conductive material. After the extension pillar 614 is formed, the photoresist layer 612 is stripped away. This extended ground plane conductive pad 600 is one example of the ground plane conductive pads 575 shown in FIG. 5.

FIGS. 7A-7C show exemplary 3D assembling of semiconductor devices including an extended ground plane conductive pad according to one aspect of the disclosure. Elements substantially identical or similar to those described in FIGS. 2, 3, 4, 5 and/or 6A-6E are not discussed in detail.

FIGS. 7A-7C illustrate bonding of a second semiconductor device 720 with a first semiconductor device 702, in which the contacts of each device are shown. Representatively, active circuitry conductive pads 740 are in electrical communication with active circuitry on an active face, and extended ground plane conductive pads 700 are in electrical communication with a ground plane on the first semiconductor device 702. The second semiconductor device 720 includes active circuitry conductive pads 732 and ground plane conductive pads 730, including a contact pad 722 and a micro-bump 724. The active circuitry conductive pads 732 of the second semiconductor device 720 come in contact with the corresponding active circuitry conductive pads 740 on an opposite face of first semiconductor device 702 in the course of assembly.

As shown in FIG. 7A, the contacts on the first semiconductor device 702 include extended ground plane conductive pads 700, made up of an extension pillar 714, a conductive bump 710, a conductive pad 704. The first semiconductor device 702 also has ground plane TSVs 706. The extended ground plane conductive pads 700 electrically communicate with the ground plane of the first semiconductor device 702 through the TSVs 706. The extended ground plane conductive pads 700 may be low resistance conductive pads that are taller (if the dies are stacked in a horizontal configuration, as shown) than the active circuitry conductive pads 732 and 740, due to the extension pillar 714, which may be thrilled as shown in FIGS. 6A-6E. Although two are shown, any number of extended ground plane conductive pads 700 may be used.

In FIG. 7B, as the first and second semiconductor devices 702, 720 are brought together, the extension pillar portion 714 of the extended ground plane conductive pads 700 physically and electrically contacts the ground plane conductive pads 730, before the active circuitry conductive pads 732 and 740 contact each other, reducing susceptibility to damage from electrostatic discharge (ESD). That is, the ground planes of both the first and second semiconductor devices 702 and 720 are electrically coupled to substantially the same potential before the active circuitry conductive pads 732, 740 electrically contact the active circuitry on the first semiconductor device 702 and the active circuitry of the second semiconductor device 720, as shown in FIG. 7C.

In the configuration shown in FIG. 7C, the ground planes of the first semiconductor device 702 and the second semiconductor device 720 are brought to substantially the same electrical potential before the respective active circuitry is electrically connected as a result of the assembly. Alternatively, the ground plane conductive pads 730 may be extended micro-bumps, or both the extended ground plane conductive pads 700 and ground plane conductive pads 730 may be extended micro-bumps compared to the active circuitry conductive pads 732 and 740. In one configuration, the extension pillar 714 portion of the extended ground plane conductive pads 700 does not change a pitch of the micro-bumps 724 following a reflow process for bonding the first and second semiconductor devices 702 and 720, for example, as shown in FIG. 8A.

FIG. 8A shows a sectional view of an assembly of 3D semiconductor devices 802 and 820 including an extended ground plane conductive pad 800 according to one aspect of the disclosure. FIG. 8B shows a top down view of the extended ground plane conductive pad 800 according to one aspect of the disclosure. Elements substantially identical or similar to those described in FIGS. 2, 3, 4, 5, 6A-6E and/or 7A-7C are not discussed in detail.

FIG. 8A shows three sets of contacts from the first and second semiconductor devices 802 and 820 bonded with each other by micro-bumps 824 following a reflow process. The first lower contact pad is an extended ground plane conductive pad 800 formed by the methods shown in FIGS. 6A-6E and a micro-bump 824. The extended ground plane conductive pad 800 includes an extended pillar 814, a conductive bump 810, a conductive pad 804, a TSV 806 and a passivation layer 808. The extended ground plane conductive pad 800 is in contact with the ground plane conductive pad 830 of the second semiconductor device 820. The ground plane conductive pad includes a contact pad 822 and a micro-bump 824. The active circuitry contact pads 832 and 840 do not include any extended potions.

As shown in FIG. 8A, in one aspect of the disclosure, the distance between an extended ground plane conductive pad 800 and a first contact pad 840-1 that does not include an extended portion is defined as a; however, the distance between the first contact pad 840-1 and a second contact pad 840-2 is defined as a+1, in which the distance between the TSVs 806 of each pad 800, 840 is uniform, in this example 40 μm. Using an extension pillar, rather than a lamer micro-bump, generally allows for a conductive pad or micro-bump having a smaller aspect ratio, providing a smaller impact to spacing arrangements of contacts. In some aspects, the use of an extension pillar causes a volume increase of approximately 8% and causes minimal, if any, bump to bump distance increases. In addition, the formation of an extension pillar, rather than a larger bump, may be more efficient to manufacture.

FIG. 8B illustrates a top down view of an extended ground plane conductive pad 800 according to one aspect of the disclosure. Representatively, the outer ring defines the bump or conductive pad 804, the next portion, illustrated by broken lines, is the micro-bump, conductive bump, or bump pad 810, the next inner portion or ring, 816, is the opening in passivation layer 808 connecting the bump pad 810 to the conductive pad 804, and the inner most portion is the extension pillar 814 of the extended ground plane conductive pad 800.

Figure 9:
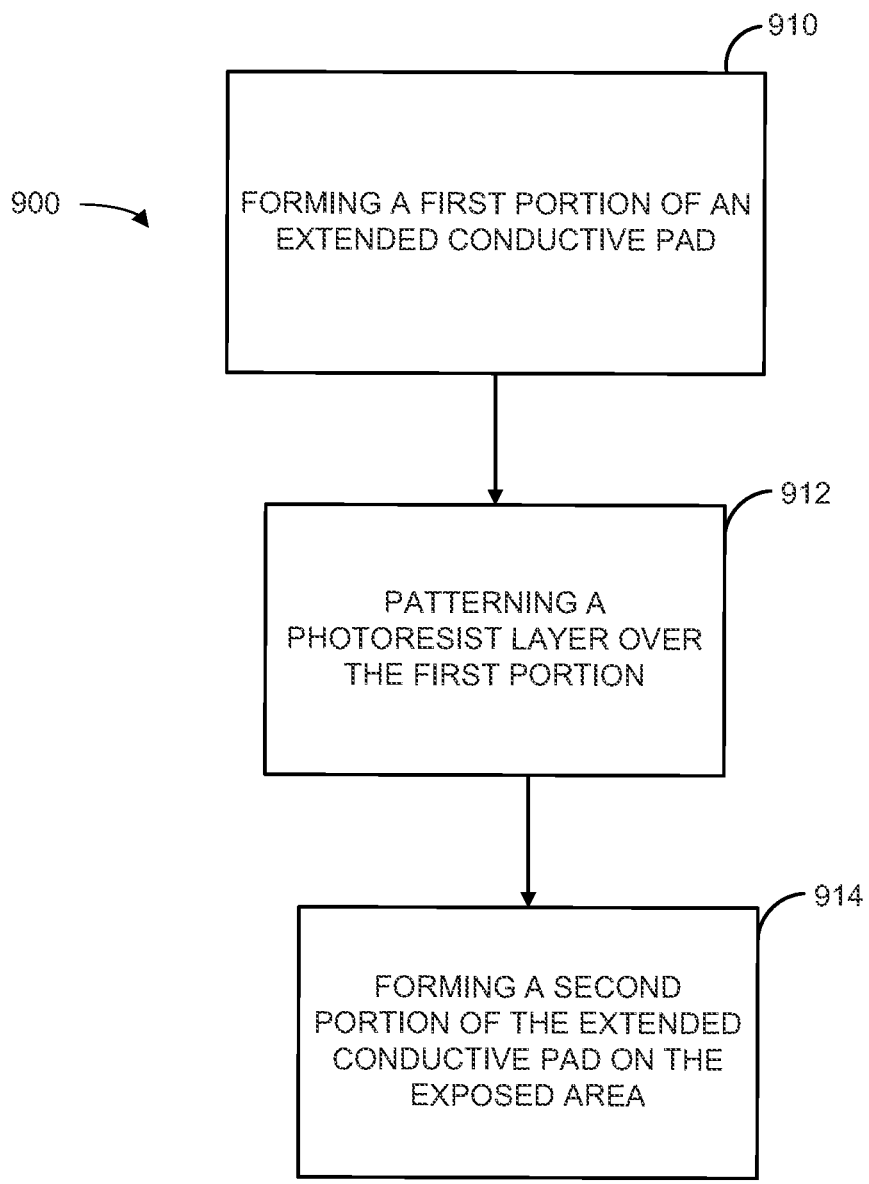
FIG. 9 is a flow diagram illustrating an exemplary method of manufacturing an extended ground plane conductive pad, according to an aspect of the present disclosure.

FIG. 9 illustrates a method 900 for forming an extended ground plane conductive pad, such as the extended ground plane conductive pad 600 shown in FIG. 6E. As an example, the extended ground plane conductive pad of FIG. 9 may be formed after a substrate having a TSV is provided (for example, see FIG. 6A) and after a conductive bump was coupled to the TSV (for example, using the processes and devices shown in FIG. 6A-6C). In block 910, a first portion of the extended conductive pad, e.g., the conductive bump 610, is formed over a conductive pad as seen in FIG. 6C. In block 912, a photo resist layer is patterned over a portion of the first portion such that an area of the first portion of the conductive pad remains exposed, for example, as seen in FIG. 6D. Next, in block 914, a second portion of a conductive pad, e.g., the extension pillar 614, is formed on the exposed area of the first portion, creating a structure such as the one shown in FIG. 6E.

In one configuration, an apparatus has means for reducing susceptibility to ESD. In one aspect, the reducing means may be a extended ground plane conductive pad, 600, 700, 800, including a conductive pad 604, a conductive bump 610 over the conductive pad 604, and an extended pillar 614 over the conductive bump 610. The extended ground plane conductive pad 600 is configured to perform the functions recited by the reducing means. The contact means may be the conductive bump 610. The height extending means may be the extended pillar 614. In another aspect, the aforementioned means may be any component or any structure configured to perform the functions recited by the aforementioned means.

The various paths connecting wafers, carrier, head, chuck, etc. may result in the ground planes of the stacked semiconductor devices being assembled so that electrical potentials vary because of finite resistance. In that case, a threshold potential difference may be selected as a limit above which an unacceptable amount of damage to the active circuitry may potentially occur.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:
1. A semiconductor device comprising:
a plurality of conductive pads coupled to active circuitry of the semiconductor device, each of the plurality of conductive pads having a first contact surface on the semiconductor device and a second contact surface opposite the first contact surface, the second contact surface configured to couple to an external device; and
at least one extended pad coupled to a ground plane of the semiconductor device, the at least one extended pad having a structure including a first portion similar to the plurality of conductive pads of the semiconductor device and a second portion that increases a height of the at least one extended pad, in which a height of a second contact surface of the at least one extended pad is greater than a height of the second contact surface of the plurality of conductive pads.

2. The semiconductor device of claim 1, in which the at least one extended pad includes a passivation layer formed at least in part adjacent to the first portion and the semiconductor device.

3. The semiconductor device of claim 1, in which the first portion is substantially hemispherical in shape.

4. The semiconductor device of claim 1, in which the second portion does not substantially affect a pitch between a set of conductive interconnects for bonding the semiconductor device to another semiconductor device during a reflow process.

5. The semiconductor device of claim 1, in which the second portion comprises a pillar.

6. The semiconductor device of claim 1, integrated into a mobile phone, a set top box, a music player, a video player, an entertainment unit, a navigation device, a computer, a hand-held personal communication systems (PCS) unit, a portable data unit, and/or a fixed location data unit.

7. A first semiconductor device comprising:
   means for coupling to active circuitry of the first semiconductor device to a second semiconductor device; and
   means for placing a ground plane of the first semiconductor device and a ground plane of the second semiconductor device at substantially a same electrical potential before coupling the active circuitry coupling means of the first semiconductor device to active circuitry coupling means of the second semiconductor device, a height of the ground plane placing means greater than a height of the active circuitry coupling means.

8. The semiconductor device of claim 7, integrated into mobile phone, a set top box, a music player, a video player, an entertainment unit, a navigation device, a computer, a hand-held personal communication systems (PCS) unit, a portable data unit, and/or a fixed location data unit.

* * * * *